(12) United States Patent
Labrunie et al.

(10) Patent No.: US 8,476,870 B2
(45) Date of Patent: Jul. 2, 2013

(54) METHOD OF DIAGNOSING DEFECTIVE ELEMENTS IN A STANDALONE SYSTEM, POWERED BY AN INTERMITTENT POWER SOURCE

(75) Inventors: Antoine Labrunie, Paris (FR); Sylvie Genies, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 746 days.

(21) Appl. No.: 12/450,956

(22) PCT Filed: May 7, 2008

(86) PCT No.: PCT/FR2008/000644
§ 371 (c)(1),
(2), (4) Date: Oct. 20, 2009

(87) PCT Pub. No.: WO2008/152238
PCT Pub. Date: Dec. 18, 2008

(65) Prior Publication Data
US 2010/0085063 A1  Apr. 8, 2010

(30) Foreign Application Priority Data
May 11, 2007  (FR) ..................................... 07 03369

(51) Int. Cl.
G01R 31/08 (2006.01)
H02B 1/04 (2006.01)
H02B 1/00 (2006.01)
H02J 1/10 (2006.01)
H02J 7/00 (2006.01)

(52) U.S. Cl.
USPC ........... 320/132; 320/101; 320/138; 324/522; 361/601; 307/29; 307/26

(58) Field of Classification Search
USPC .................. 320/101, 132, 138, 136, 137, 134, 320/135; 324/522; 361/601; 307/29, 26
See application file for complete search history.

(56) References Cited

U.S. PATENT DOCUMENTS
4,484,130 A * 11/1984 Lowndes et al. ............. 320/116
4,937,528 A *  6/1990 Palanisamy ................. 324/430
(Continued)

FOREIGN PATENT DOCUMENTS
JP  A-2005-340464  12/2005

OTHER PUBLICATIONS

Imamura et al.; "Real-time Monitoring/Diagnostic System for Photovoltaic Plant and Battery;" *11th E.C. Photovoltaic Solar Energy Conference*; Oct. 12, 1992; pp. 1266-1270; Montreux, Switzerland.

(Continued)

*Primary Examiner* — Edward Tso
*Assistant Examiner* — Alexis Boateng
(74) *Attorney, Agent, or Firm* — Oliff & Berridge, PLC

(57) ABSTRACT

The diagnostic method applies to a standalone system including a generator, a power regulator and a power storage element. The method includes comparison of the effective charging power or current of the power storage element respectively with a predefined power or current threshold. If the effective charging power or current is lower than said threshold, the power storage element is disconnected. An abnormal behavior is then detected either by comparing the effective charging power with the smaller of the values representative of the theoretical charging power of the power storage element and of the maximum power able to be delivered by the generator and comparing the effective and theoretical charging voltages, or by comparing the effective and theoretical charging currents.

9 Claims, 6 Drawing Sheets

U.S. PATENT DOCUMENTS

| | | | | |
|---|---|---|---|---|
| 5,669,987 | A * | 9/1997 | Takehara et al. | 136/244 |
| 6,031,354 | A * | 2/2000 | Wiley et al. | 320/116 |
| 6,091,228 | A * | 7/2000 | Chady et al. | 320/132 |
| 6,892,165 | B2 | 5/2005 | Yagi et al. | |
| 7,521,936 | B2 * | 4/2009 | Stanley | 324/522 |
| 7,667,350 | B2 * | 2/2010 | Norimatsu et al. | 307/87 |
| 2002/0059035 | A1 * | 5/2002 | Yagi et al. | 702/59 |
| 2005/0062456 | A1 * | 3/2005 | Stone et al. | 320/116 |
| 2005/0134230 | A1 * | 6/2005 | Sato et al. | 320/136 |
| 2005/0194937 | A1 * | 9/2005 | Jacobs | 320/135 |
| 2006/0055377 | A1 * | 3/2006 | Okubo et al. | 320/166 |
| 2006/0087800 | A1 * | 4/2006 | Savage | 361/601 |
| 2006/0145658 | A1 * | 7/2006 | Wang | 320/107 |
| 2007/0132457 | A1 * | 6/2007 | Okamoto et al. | 324/522 |
| 2007/0194759 | A1 * | 8/2007 | Shimizu et al. | 320/166 |

OTHER PUBLICATIONS

Ortega et al.; "Monitoring and Charge-Control of Lead-Acid Batteries in Photovoltaic Applications;" *Telecommunications Energy Conference*; Sep. 19, 2004; pp. 260-263; Piscataway, New Jersey.

Benghanem et al.; "Data Acquisition System for Photovoltaic Systems Performance Monitoring;" *IEEE Instrumentation and Measurement Technology Conference*; May 19, 1997; pp. 1030-1033; Ottawa, Canada.

\* cited by examiner

METHOD OF DIAGNOSING DEFECTIVE ELEMENTS IN A STANDALONE SYSTEM, POWERED BY AN INTERMITTENT POWER SOURCE

BACKGROUND OF THE INVENTION

The invention relates to a method for diagnosing defective elements in a standalone system powered by an intermittent power source and comprising in series a generator, a power regulator and a power storage element, the power regulator being able to comprise a power converter.

STATE OF THE ART

Standalone systems powered by intermittent power sources (for example: photovoltaic panels, wind power generators etc.) are destined to develop. Moreover, these standalone systems are preferably installed in isolated places which are difficult to access for which the cost of a conventional power supply by cable would be prohibitive. In this type of configuration, optimizing maintenance and autonomy is of paramount importance to enable a large reduction of operating costs.

Although conventional systems sometimes enable power production to be monitored, they are however not designed to react in the case of low production, nor are they designed to inform the user or the maintenance personnel of the origin of a malfunction.

In a conventional standalone system, the battery can be connected directly to the photovoltaic panel. The photovoltaic panel is designed (number and arrangement of cells) to charge a lead battery. The power point of the photovoltaic panel is adjusted by the voltage at the battery terminals. The more a battery is charged, the higher its voltage and the weaker the current delivered by the panel. Finally, lead batteries can easily withstand overcharging.

However, in most standalone systems:
there is battery charging management (voltage thresholds, connection/disconnection of the different loads),
there is no power conversion component,
there is system production monitoring,
there is no panel operation monitoring.

Japanese Patent application JP2005340464 describes a diagnosis system using comparison of the ratio of instantaneous power over standard power between the different panels of a photovoltaic power plant. Satisfactory operation or malfunctioning of the photovoltaic panels is deduced from this comparison. The standard power of the different photovoltaic panels depending on the time of day and the power delivered by each panel during the previous days are previously stored in the system memory.

U.S. Pat. No. 6,892,165 describes computation of standard characteristics of a photovoltaic system, a computation based on the system installation conditions and comparison of this standard value with measured values. Satisfactory operation of the system is deduced from this comparison.

In current standalone installation management systems, the user (or the maintenance personnel) is informed too late when there is no longer any power source and the battery is discharged. Furthermore, the user has no information on the cause of the malfunction.

OBJECT OF THE INVENTION

The object of the invention consists in palliating the above-mentioned shortcomings and in particular in detecting the causes of malfunctioning before there is no longer any power source and the battery is discharged.

This object is achieved by a method according to the appended claims and more particularly in a first alternative embodiment by the fact that the method comprises
measuring the effective charging current and voltage, determining the effective charging power of the storage element according to said measurements, and comparing said effective charging power with a predefined power threshold,
disconnecting the power storage element if the charging power is lower than the power threshold,
the power storage element being disconnected, measuring the maximum power able to be delivered by the generator at the time of measuring, and determining the state of charge of the disconnected power storage element and the corresponding theoretical charging voltage and charging power,
differentiating between a normal behavior, malfunctioning of the generator and malfunctioning of the power storage element according to the comparison between the effective charging power of the storage element and the smaller of the values representative of the theoretical charging power of the storage element and of the maximum power able to be delivered by the generator, and by comparing the effective charging voltage and the theoretical charging voltage of the power storage element.

This object is also achieved in a second particular alternative embodiment by the fact that the power storage element being connected directly by switching means, the method comprises
measuring a effective charging current (Ibatt) and a effective charging voltage (Ubatt), comparing the effective charging current (Ibatt) with a predefined first current threshold (Ithresh),
disconnecting the power storage element (1) if said effective charging current (Ibatt) is lower than the current threshold (Ithresh),
the power storage element (1) being disconnected, measuring the maximum current (Imax) and maximum voltage (Umax) able to be delivered by the generator (2) at the time of measuring, determining the state of charge (SOC) of the disconnected power storage element (1), a theoretical charging current (Ithbatt) and a theoretical charging voltage (Uthbatt),
differentiating between a normal behavior and malfunctioning of the standalone system according to comparison of the effective charging current (Ibatt) with the theoretical charging current (Ithbatt).

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF A PARTICULAR EMBODIMENT OF THE INVENTION

Figure 1:
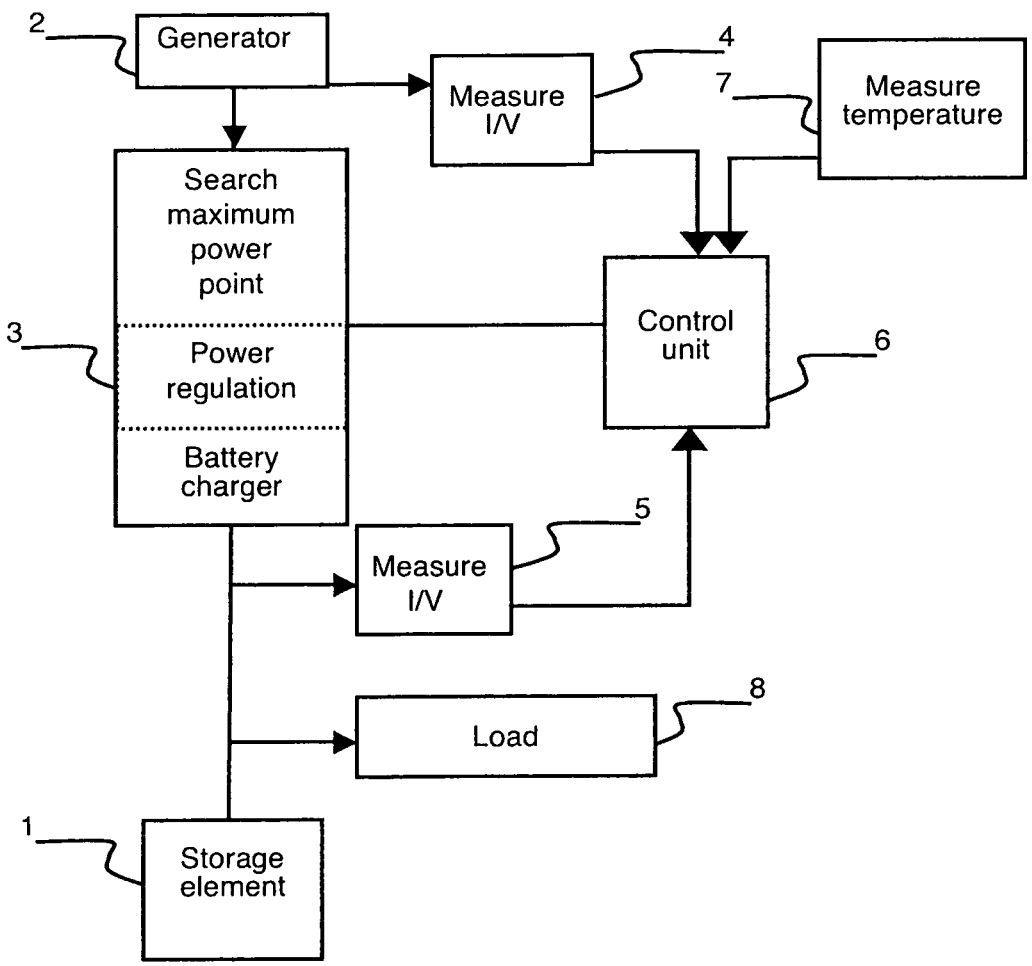
FIG. 1 schematically represents a standalone system in which the method according to the invention can be implemented.

As illustrated in FIG. 1, the standalone system comprises at least one battery 1 constituting a power storage element, a power generator 2 delivering an intermittent power supply, and a power regulator 3 connected between generator 2 and battery 1. Power regulator 3 advantageously comprises not only a power circuit but also a search module of the maximum power point able to be delivered by generator 2, with a corresponding search algorithm, and a charging module of power storage element 1 with a dedicated charging algorithm. The search and charging algorithms can be integrated in power regulator 3 and/or in a control unit 6. Measuring circuits 4 and 5 respectively measuring the voltage and current on output from generator 2 and at the terminals of battery 1 are connected to a control unit 6, also connected to power regulator 3. A temperature measurement circuit 7 is also connected to control unit 6 and a load 8 is conventionally supplied by battery 1.

Power generator 2 is for example of the wind power or micro-hydraulic type or advantageously a photovoltaic panel.

Power regulator 3 preferably comprises a BUCK converter. Control unit 6 is thus designed to control matching between the power supplied by generator 2 and charging of battery 1 by means of power regulator 3.

Control unit 6 controls opening and closing of switching elements (not shown) connected between photovoltaic panel 2 and battery 1 and designed to enable battery 1 to be disconnected. The switching elements are preferably integrated in power regulator 3.

In advantageous manner, data relative to charging profiles of battery 1, enabling theoretical charging power Pthbatt and theoretical charging voltage Uthbatt to be determined according to the state of charge and the temperature of battery 1, is stored in the memory of control unit 6.

Circuit 7 advantageously measures the temperature T of battery 1.

The standalone system advantageously comprises a device for communication with the outside (not shown) which can be integrated in control unit 6.

Figure 2:
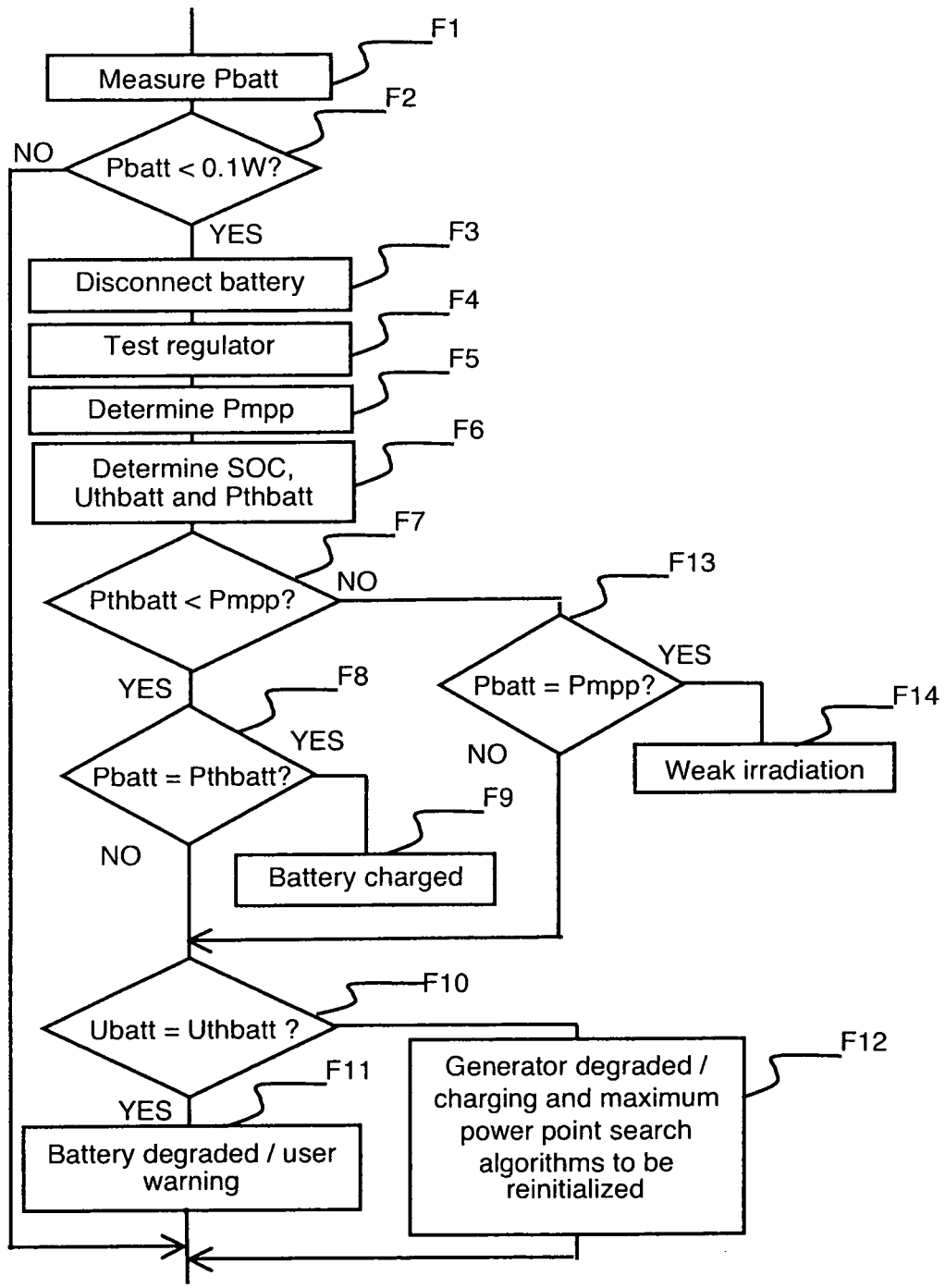
FIG. 2 represents a particular embodiment of a method according to the invention in flowchart form.

In the particular embodiment illustrated by the flowchart of FIG. 2 and corresponding to a power regulator 3 comprising a power converter, control unit 6 determines (step F1) the effective charging power Pbatt of battery 1 from measurements (I/V) of the voltage and current at the terminals of battery 1 provided by measuring circuit 5. It compares (F2) effective charging power Pbatt of battery 1 with a predefined threshold which depends on the storage element and which corresponds to the end-of-charging power, for example 0.1 watts.

If effective charging power Pbatt is lower than the predefined threshold (YES output of F2), control unit 6 performs disconnection of battery 1 (F3) after storing the last voltage and current values measured by measuring circuits 4 and 5.

Control unit 6 then triggers a test protocol to check that all the elements involved in the charging process of battery 1 are functional. The test protocol in particular uses the current and voltage values measured just before disconnection of battery 1.

The test protocol can begin (F4) by optional testing of power regulator 3. A particular embodiment of this test will be described in greater detail further on with reference to FIG. 3. The object of the test is then to detect malfunctioning of the generator and/or battery 1. In a step F5, control unit 6 computes the maximum power able to be delivered by photovoltaic panel 2 Pmpp on the basis of measurements of the voltage and current at the terminals of the photovoltaic panel when the latter is adjusted to its maximum power point, with the effective sunlight at the time the measurements are made.

Measurement of these two quantities (voltage and current) requires the ability to dissipate or to use this power in the system. However power electronics are not scheduled for this type of operation and are therefore not able to dissipate the whole of the power supplied by photovoltaic panel 2.

A first possibility consists in successively measuring the no-load voltage Voc and the short-circuit current of the panel in order to deduce therefrom the voltage at maximum power point Vmpp and the associated current Impp. To do this, switching from one state to the other has to be performed quickly.

Another possibility consists in making impedance variations and very brief measurements in order to be able to interpolate the maximum power point. The power is high, but the time is short and the energy is therefore low. A certain number of measurements can for example be made during switching between open circuit and short-circuit.

Control unit 6 can then advantageously compare the voltage values in open circuit Voc and at maximum power point Vmpp with known nominal values. This comparison can further enable it to be ensured that all the photovoltaic panel cells are operating. If this is the case, control unit 6 computes power Pmpp.

Control unit 6 then determines the state of charge (SOC) of battery 1, for example by measuring the no-load voltage and temperature T of battery 1 (supplied by measuring circuits 5 and 7) and by means of look-up tables. To achieve precise measurement of the state of charge (SOC), this step F6 is preferably performed after disconnection of the battery, after a predefined waiting period that depends on the type, temperature and state of charge of the battery, typically about 10 minutes for a Lithium battery. This waiting period enables the battery to stabilize its no-load voltage. This estimation of state of charge (SOC) is advantageously used by control unit 6 to define the desirable charging power for various charging profiles of battery 1. For a determined state of charge (SOC), control unit 6 in particular determines the theoretical charging power Pthbatt(SOC) and theoretical voltage Uthbatt(T, SOC), which also depends on the temperature of battery 1, in theory enabling optimal charging of the battery. The subsequently used values Pthbatt and Uthbatt therefore depend on the effective state of charge (SOC) of battery 1 at the time they are determined (step F6).

The data relative to charging profiles of battery 1 preferably comprise not only the type of battery used and the maximum permissible charging current, but also the charging power and the type of charging according to the state of charge of the battery.

Control unit 6 then uses different measured and determined quantities to determine the origin of the previously detected low charging power (YES output of F2).

In FIG. 2, theoretical charging power Pthbatt, is first compared (F7) with maximum power Pmpp.

If (YES output of F7) maximum power Pmpp of photovoltaic panel 2 is greater than theoretical charging power of battery 1 (Pmpp>Pthbatt), then photovoltaic panel 2 does not a priori limit charging of battery 1. Effective charging power Pbatt is then compared (F8) with theoretical charging power Pthbatt of battery 1.

If (YES output of F8) effective charging power is equal to theoretical charging power (Pbatt=Pthbatt) of battery 1, battery 1 is then considered to be charged (F9), which explains the low charging power required for battery 1. In this configuration, the standalone system can advantageously inform the user.

In a corresponding example, when effective charging power Pbatt reaches the threshold value 0.1 W, control unit 6 measures a maximum power Pmpp able to be delivered by photovoltaic panel 2 of 10 W and a state of charge of battery 1 of 95%. By means of the data relative to charging profiles of battery 1, control unit 6 determines a theoretical charging power Pthbatt of 0.1 W. Maximum power Pmpp of photovoltaic panel 2 is then greater than theoretical charging power of battery 1 (Pmpp (10 W)>Pthbatt (0.1 W)) and effective charging power Pbatt is equal to theoretical charging power (0.1 W) of battery 1. Battery 1 is therefore charged.

If on the other hand (NO output of F8) effective charging power Pbatt is different from theoretical charging power Pthbatt, it is assumed that charging power is lower than theoretical charging power (Pbatt<Pthbatt) and that the battery is not charging normally. A charging power greater than the theoretical charging power (Pbatt>Pthbatt) does in fact correspond to the case where battery 1 is charged and regulator 3 delivers more power than necessary to the battery. As the powers involved are low (Pbatt<0.1 Watt), this case is assimilated to the previous case Pbatt=Pthbatt, measurement errors aside. Control unit 6 then compares (F10) effective charging voltage Ubatt and theoretical charging voltage Uthbatt to detect the defective element.

If (YES output of F10) effective charging voltage is equal to theoretical voltage according to the state of charge of battery 1 and the temperature (Ubatt=Uthbatt(T, SOC)), then the battery seems to be degraded and the user is informed (F11). It is in fact assumed that the main consequence of degradation of battery 1 is an increase of its internal impedance and therefore a shift of the current and voltage operating points of battery 1. In the opposite case (NO output of F10), it is assumed that effective charging voltage is lower than theoretical charging voltage (Ubatt<Uthbatt(T, SOC)), and it is photovoltaic panel 2 that seems to be degraded, and the search algorithm for seeking the maximum power point of photovoltaic panel 2 and the charging algorithm of battery 1 are reinitialized (F12). It is in fact considered that the main consequence of degradation of photovoltaic panel 2 is a degradation of its voltage/current curve and the occurrence of local minima and maxima which prevents the maximum power point search algorithm from finding the effective operating point of photovoltaic panel 2. Photovoltaic panel 2 thus operates at a lower power point than its maximum point. The case Ubatt>Uthbatt is considered to be impossible or improbable at the level of step F10.

In a corresponding example, when the effective charging power reaches the threshold value 0.1 W, control unit 6 measures a maximum power able to be delivered by photovoltaic panel 2 of 10 W and a state of charge of battery 1 of 70%. By means of the data relative to charging profiles of battery 1, control unit 6 determines a theoretical charging power Pthbatt of 5 W. Control unit 6 further determines that charging voltage Ubatt is lower than theoretical charging voltage Uthbatt. The maximum power of photovoltaic panel 2 is therefore higher than the theoretical charging power of battery 1 (Pmpp (10 W)>Pthbatt (0.1 W)), and the effective charging power is lower than the theoretical charging power (Pbatt(0.1 W)<Pthbatt(5 W)). Panel 2 is therefore suspected to be defective and the charging algorithm and the search algorithm for seeking the maximum power point (F12) are reinitialized.

In another corresponding example, when the effective charging power reaches the threshold value 0.1 W, control unit 6 measures a maximum power able to be delivered by photovoltaic panel 2 of 1 W and a state of charge of battery 1 of 70%. Theoretical charging power Pthbatt is 5 W. The maximum power of photovoltaic panel 2 is therefore lower than the theoretical charging power of battery 1 (Pmpp (1 W)<Pthbatt (5 W)) and the effective charging power is lower than the maximum power of photovoltaic panel 2 (Pbatt(0.1 W)<Pmpp(1 W)). Charging voltage Ubatt is moreover equal to the theoretical value Uthbatt. Battery 1 is therefore suspected to be degraded and the user is informed (F11).

If (NO output of F7) maximum power of the panel is lower than theoretical charging power of the battery (Pmpp<Pthbatt), photovoltaic panel 2 then a priori limits charging of battery 1. Maximum power Pmpp of photovoltaic panel 2 is then compared (F13) with effective charging power Pbatt of battery 1.

If (YES output of F13) the effective charging power of battery 1 is equal to the maximum power of photovoltaic panel 2 (Pbatt=Pmpp), this means that the irradiation is weak (F14) and that battery 1 is using all the available power. Operation is therefore normal.

In a corresponding example, when the effective charging power reaches the threshold value 0.1 W, control unit 6 measures a maximum power able to be delivered by photovoltaic panel 2 of 0.1 W and a state of charge of battery 1 of 70%. Theoretical charging power Pthbatt is 5 W. The maximum power of photovoltaic panel 2 is therefore lower than the theoretical charging power of battery 1 (Pmpp (0.1 W)<Pthbatt (5 W)) and the effective charging power is equal to the maximum power of photovoltaic panel 2 (0.1 W). This therefore means that the irradiation is weak (F14) and that the system is operating correctly.

If (NO output of F13) the effective charging power of battery 1 is not equal to the maximum power of photovoltaic panel 2, the charging power never being able to be greater than the power delivered by the generator, this means that the effective charging power of battery 1 is lower than the maximum power of the photovoltaic panel (Pbatt<Pmpp), and that the battery is not charging normally. Under these conditions, control unit 6, as before, compares (F10) effective charging voltage Ubatt and theoretical charging voltage Uthbatt to find out which element is defective.

In a more general manner, in the test protocol, effective charging power Pbatt is compared with the smaller of the values representative of theoretical charging power Pthbatt of power storage element 1 and of maximum power Pmpp able to be delivered by generator 2. If theoretical charging power Pthbatt is lower than maximum power Pmpp able to be delivered by generator 2 (YES output of F7), then effective charging power Pbatt is compared with theoretical charging power Pthbatt, if not (NO output of F7), effective charging power Pbatt is compared with the maximum power able to be delivered by generator 2. Furthermore, comparison of charging voltage Ubatt with theoretical charging voltage Uthbatt only takes place if charging power Pbatt is lower than theoretical charging power Pthbatt and than maximum power Pmpp able to be delivered by generator 2.

Reinitialization of an algorithm (F11 or F12) does not enable generator 2 to be considered to be defective the first time. In a preferred embodiment, generator 2 is indicated as being defective after a certain number of reinitializations, for example after three reinitializations.

Figure 3:
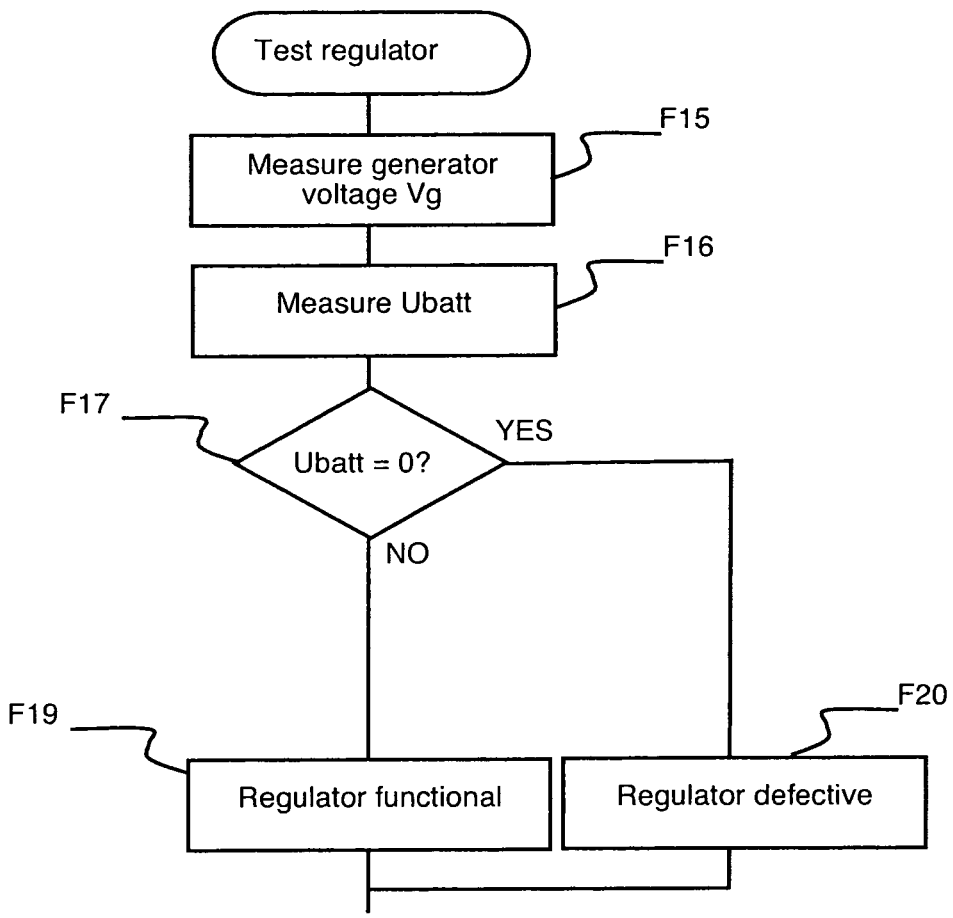
FIG. 3 illustrates a particular embodiment of testing of the regulator of the method according to FIG. 2.

As represented in FIG. 3, testing of regulator (F4) can comprise measuring the voltage at the terminals of power regulator 3. In the standalone system represented in FIG. 1, the voltages measurements can be made by measuring circuits 4 and 5. In this particular case, the input voltage of the power regulator corresponds to the voltage at the generator terminals Vg and the output voltage of the regulator, Ubatt, is the voltage at the terminals of storage element 1.

Test protocol (F4) of power regulator 3 can comprise the following steps. Control unit 6 has a new measurement made (F15) of the voltage supplied by generator 2 or uses the previously stored value. Control unit 6 also has a new measurement made (F16) of the voltage supplied to battery 1 or uses the previously stored value. Control unit 6 then tests (F17) whether the value of the voltage supplied to battery 1 is zero.

If (YES output of F17) the voltage supplied to the battery is zero, power regulator 3 is then declared defective (F20). If not (NO output of F17), power regulator 3 is considered to be functional (F19).

In an alternative embodiment, the same technical problem can be solved in a standalone system in which the power regulator does not comprise a converter. As the power converter is an onerous element, it is also possible to perform charging of the battery according to another charging protocol.

Regulation of charging of battery 1 from generator 2 is then performed by means of switching elements arranged between generator 2 and battery 1. In this case, when charging is performed, the power delivered by the generator is no longer suitable for charging the battery, and it is no longer possible to make the ratio Uinput/Uoutput vary. The voltages at the terminals of the generator and of the battery are therefore identical. In this configuration, the generator and storage element are connected directly by means of the switching elements.

Figure 4:
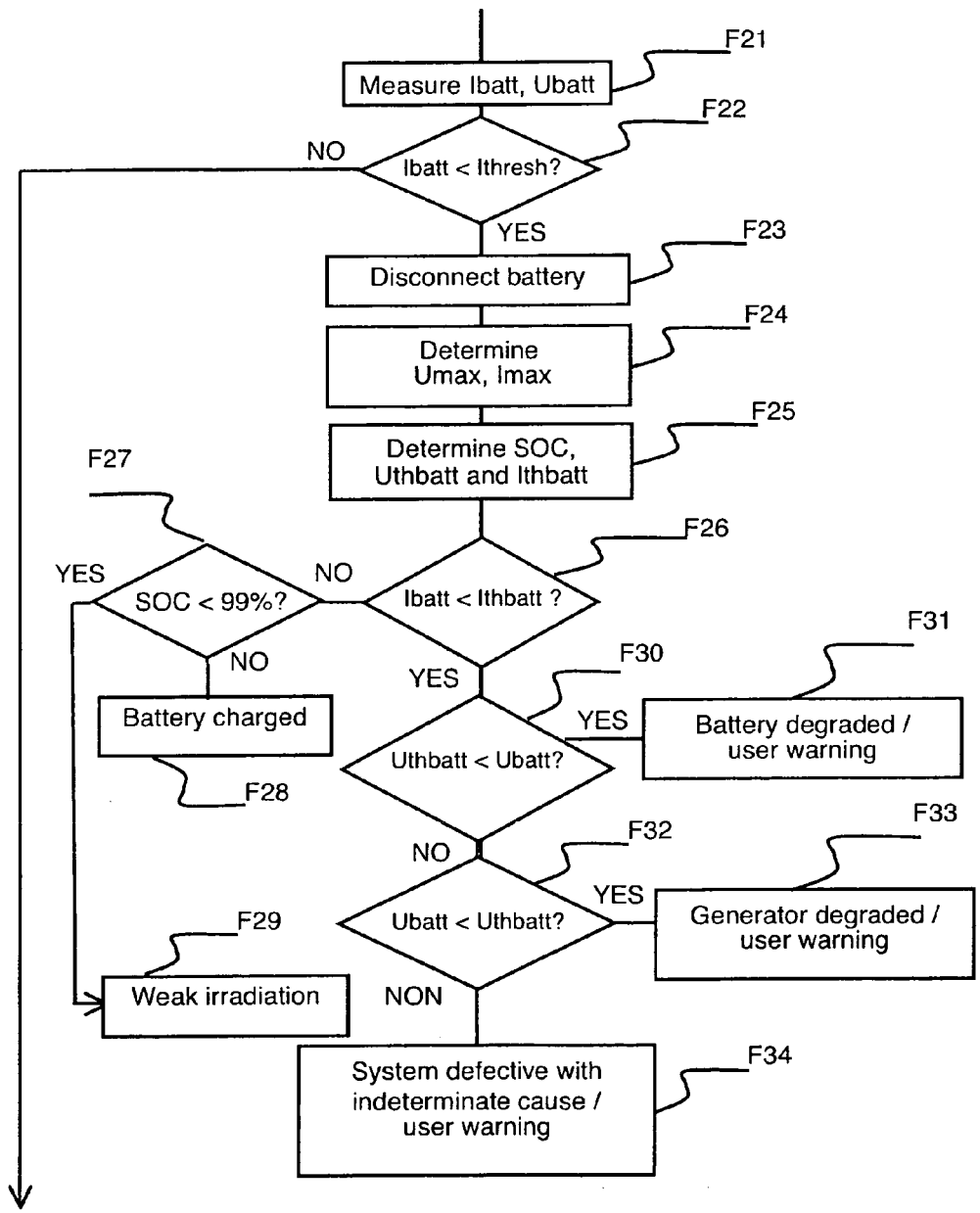
FIG. 4 represents a second particular embodiment of a method according to the invention in flowchart form.

In the particular embodiment illustrated by the flowchart of FIG. 4 and corresponding to a power regulator 3 not comprising a power converter, control unit 6 determines (step F21) the effective charging current Ibatt of battery 1 by means of measuring circuit 5. Advantageously, the effective charging current is also measured by means of measuring circuit 4. Control unit 6 compares (F22) effective charging current Ibatt of battery 1 with a predefined first current threshold Ithresh, preferably equal to the end-of-charging current which depends directly on the battery (type, dimension, . . . ) and which is typically equal to 5% of the nominal charging current.

If effective charging current Ibatt is lower than the predefined threshold (YES output of F22), control unit 6 causes (F23) disconnection of battery 1 after storing the last voltage and current values (Ubatt and Ibatt) measured by measuring circuits 4 and 5.

In a step F24, control unit 6 calculates the maximum voltage Umax and current Imax able to be delivered by photovoltaic panel 2 on the basis of measurements of the voltage and current at the terminals of the photovoltaic panel. The maximum voltage and current values able to be delivered by the generator are independent from one another and correspond to two distinct operating conditions of the generator, the open-circuit voltage and short-circuit current. By means of these two items of information, control unit determines the normal operating curve of the generator. This curve is computed by means of specific data representative of the generator which are integrated in the control unit memory.

Figure 5:
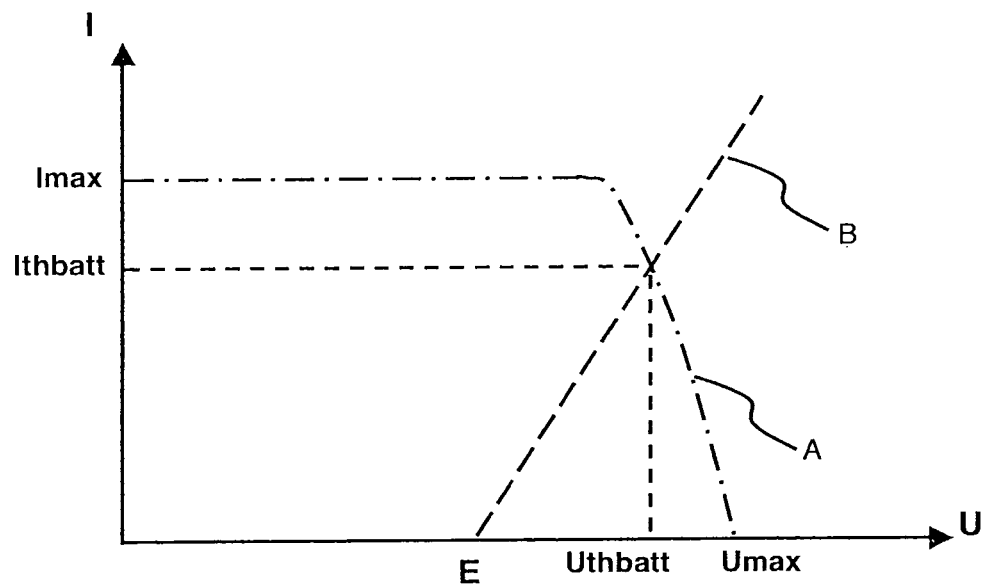
FIG. 5 schematically represents the electrical characteristics of the power storage element and of the generator in normal operation according to the particular embodiment illustrated in FIG. 4.

As illustrated in FIG. 5, generator operating curve A computed by control unit 6 represents the relation which links the current delivered and the voltage at the generator terminals in normal operation. It can be observed that in a first domain which corresponds to the weakest voltage values, the current able to be delivered is substantially maximum and constant, i.e. maximum current Imax. Then, as the voltage increases, the current decreases in substantially linear manner until it becomes zero. When the current delivered by the generator is zero, the voltage at the terminals of this generator is maximum and corresponds to maximum voltage Umax. Generator operating curve A therefore takes account of the current climatic data, for example sunlight (irradiation and temperature).

Then control unit 6 determine state of charge (SOC) of battery 1 (F25). The protocol for determining the state of charge is advantageously identical to the one explained above. This estimation of state of charge (SOC) is advantageously used by control unit 6 to define the required charging parameters for various charging profiles of battery 1.

Control unit 6 also has the general characteristics of the storage element stored in memory and, in normal operation, is therefore able to know the relation that exists between the charging current and the voltage at its terminals. This relation is typically represented by curve B (FIG. 5) and is of the form U=E+RI in which:
U is the voltage at the terminals of the storage element,
E is the electromotive force of the storage element,
R is the internal resistance of the storage element,
I is the charging current.

In conventional manner, electromotive force E of the storage element varies according to state of charge (SOC) of the battery. In addition, depending on the type of battery used, small variations of internal resistance R of the storage element can be observed.

Control unit 6 then computes the values of the theoretical charging voltage and of the theoretical charging current (Uthbatt/Ithbatt) which correspond to matching between the electrical characteristics able to be delivered by the generator and the electrical characteristics imposed by charging of storage element 1, i.e. the intersection of curves A and B of FIG. 5. In this way, the charging voltage and current determined by control unit 6 correspond to the theoretical charging voltage and current Uthbatt and Ithbatt.

Thus, for a determined state of charge (SOC), control unit 6 determines the theoretical charging current Ithbatt and theoretical voltage Uthbatt(T,SOC), which also depend on the temperature of battery 1. This theoretical charging current/voltage couple (Uthbatt/Ithbatt) in theory enables optimum charging of the battery.

As specified before, the generator and storage element being in direct connection, the voltage at the terminals of the storage element and of the generator is identical and the current that leaves the generator corresponds to that which charges the storage element. This results in the operating point having to belong to A and B. The theoretical charging current is therefore always lower than Imax and varies as charging of the battery takes place from Imax up to the end-of-charging current, for example Ithresh. Movement of the theoretical charging current on the characteristic (U/I) of the generator depends on the characteristics of the generator and of the battery.

Advantageously, the characteristics of the storage element and of the generator are chosen such that theoretical charging current Ithbatt is not lower than a limit value, for example 80% of the maximum current able to be delivered (0.8 Imax), which corresponds substantially to maximum power point Pmpp able to be delivered by generator 2. This condition links the size of the generator to the size of the battery. If the generator is over-dimensioned with respect to the previous example (0.8 Imax), theoretical charging current Ithbatt cannot be less than 90% of the maximum current able to be delivered or will even be substantially equal to the maximum current able to be delivered Imax. For example, this type of assembly can be implemented for charging a lead battery withstanding a high current at the end of charging. In the opposite case, if supplying a high current at the end of charging is to be avoided, the generator is under-dimensioned.

The values Uthbatt and Ithbatt used thereafter depend on the effective state of charge (SOC) of battery 1 at the time of determining (step F6).

Control unit 6 then uses different measured and determined quantities to determine the origin of the weak charging current detected beforehand (YES output of F22).

In FIG. 4, effective charging current Ibatt is compared (F26) with theoretical charging current Ithbatt to check whether effective charging current Ibatt is lower than theoretical charging current (Ibatt<Ithbatt).

If (NO output of F26) effective charging current Ibatt is greater than or equal to theoretical charging current Ithbatt, then the standalone system is operating normally.

Advantageously, the state of charge of the battery is then compared with a predetermined end-of-charging state (F27), for example 99% (SOC<99%). If (NO output of F27) the state of charge is greater than or equal to the predetermined end-of-charging state, the battery is considered to be charged (F28). In the opposite case (YES output of F27), photovoltaic panel 2 a priori limits charging of battery 1. This means that the irradiation is weak (F29) and that battery 1 is using all the available current.

If (YES output of F26), the effective charging current is lower than the theoretical charging current (Ibatt<Ithbatt), it is then assumed that the standalone system has an abnormal operation and a search is performed to find the defective element.

Theoretical charging voltage Uthbatt is then compared (F30) with effective charging voltage Ubatt to check whether effective charging voltage Ubatt is greater than voltage theoretical charging voltage of battery 1 (Ubatt>Uthbatt).

Figure 6:
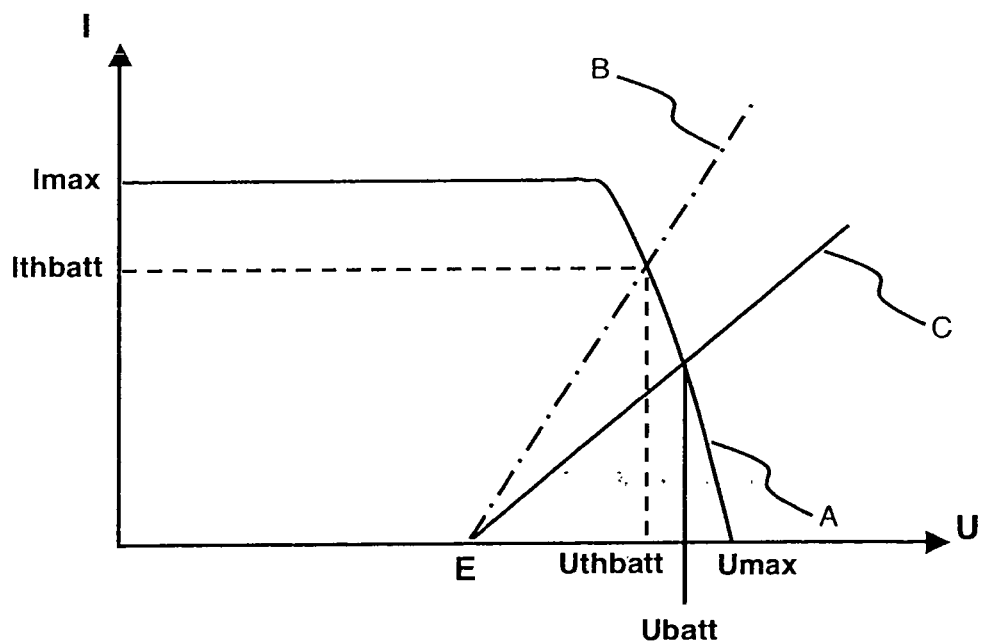
FIGS. 6 and 7 schematically represent the electrical characteristics of the power storage element and of the generator in malfunctioning operation of the power storage element and of the generator according to the particular embodiment illustrated in FIG. 4.

If (YES output of F30) effective charging voltage Ubatt is greater than theoretical charging voltage of battery 1 (Ubatt>Uthbatt), then the battery seems to be degraded and the user is informed (F31). It is in fact assumed that the main consequence of degradation of battery 1 is an increase of its internal impedance and therefore a shift of the current and voltage operating points of battery 1, as illustrated by curve C in FIG. 6.

In the opposite case (NO output of F30), theoretical charging voltage Uthbatt and effective charging voltage Ubatt (F32) are again compared to check whether effective charging voltage Ubatt is lower than theoretical charging voltage Uthbatt of battery 1 (Ubatt<Uthbatt).

Figure 7:
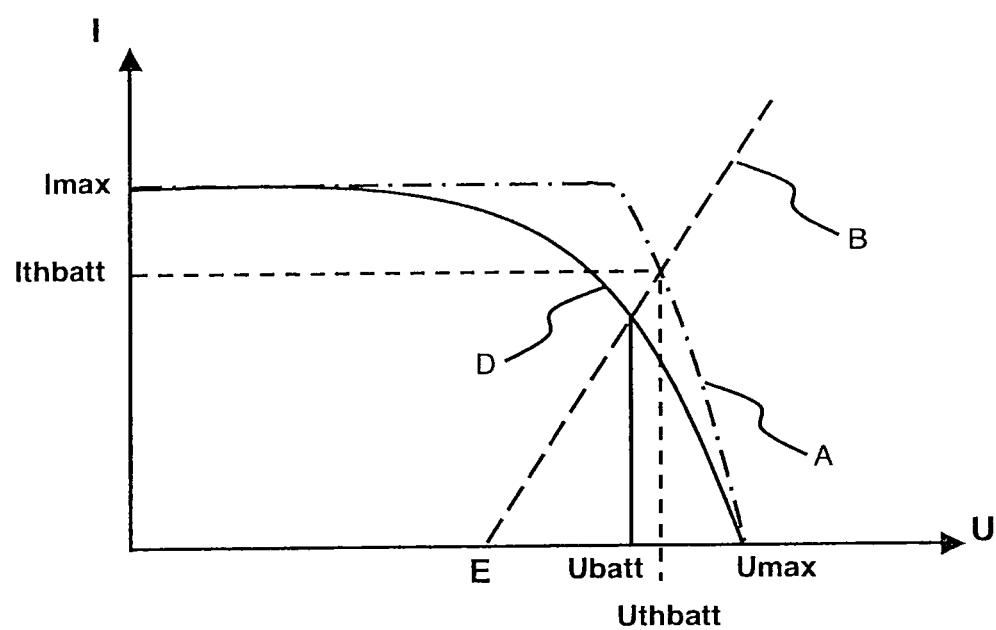

If (YES output of F32) effective charging voltage Ubatt is lower than theoretical charging voltage of battery 1 (Ubatt<Uthbatt), then it is photovoltaic panel 2 that seems to be degraded (F33). It is in fact considered that the main consequence of degradation of photovoltaic panel 2 is degradation of its voltage/current curve, i.e. its voltage/current curve is situated under the nominal voltage/current curve, as illustrated by curve D in FIG. 7. This therefore results in a shift of the current and voltage operating points of battery 1 with respect to the theoretical operating points. Photovoltaic panel 2 is therefore suspected to be defective and the user is informed (F33).

In the opposite case (NO output of F32), theoretical charging voltage Uthbatt Uthbatt is equal to charging voltage Ubatt, operation of the standalone system is abnormal, but no cause can be determined and the user is informed (F34). This case may correspond to simultaneous degradation of the generator and of the battery.

The invention claimed is:

1. A method for diagnosing defective elements in a standalone system comprising
providing the standalone system having:
an intermittent power source providing a first voltage and a first current,
a power regulator electrically coupled to the intermittent power source,
a power storage element charged by the power regulator with an effective charging current and an effective charging voltage,
measuring the effective charging current and the effective charging voltage,
determining an effective charging power according to said measurements of the effective charging current and the effective charging voltage,
comparing the effective charging power with a predefined power threshold,
disconnecting the power storage element if the effective charging power is lower than the power threshold,
measuring a maximum instantaneous deliverable power by the intermittent power source while the power storage element is disconnected,
determining a state of charge of the disconnected power storage element,
determining a theoretical charging voltage of the power storage element, the theoretical charging voltage being a function of the measured state of charge,
determining a theoretical charging power of the power storage element, the theoretical charging power being a function of the measured state of charge,
comparing the effective charging power of the storage element with the smaller of the theoretical charging power of the storage element and of the maximum power deliverable by the generator, and according to the comparing the effective charging voltage with the theoretical charging voltage of the power storage element so as to determine a normal behavior of the standalone system, a malfunctioning behavior of the generator and a malfunctioning behavior of the power storage element.

2. The method according to claim 1, comprising:
measuring an input voltage at input terminals of the power regulator and an output voltage at output terminals of the power regulator and,
comparing the input voltage and the output voltage so as to detect a fault in the power regulator.

3. The method according to claim 2, wherein the power regulator is considered to be defective if the output voltage is zero.

4. The method according to claim 1, wherein if the effective charging power of the power storage element is lower than the theoretical charging power and lower than the maximum power able to be delivered by the generator and if the theoretical charging voltage is equal to the effective charging voltage, the power storage element is considered to be degraded.

5. The method according to claim 4, comprising indicating defectiveness of the standalone system if the power storage element is considered to be degraded.

6. The method according to claim 1, wherein if the effective charging power of the power storage element is lower than the maximum power able to be delivered by the intermittent power source and lower than the theoretical charging power and if the theoretical charging voltage is greater than the effective charging voltage, the intermittent power source is considered to be degraded.

7. The method according to claim 6, comprising reinitializing a charging algorithm if the intermittent power source is considered to be degraded.

8. The method according to claim 6, comprising reinitializing a search algorithm of the maximum power point of the power regulator if the intermittent power source is considered to be degraded.

9. The method according to claim 7, comprising indicating defectiveness of the intermittent power source if the charging algorithm is reinitialized after a predefined number of successive times.

* * * * *